United States Patent
Yoon et al.

(10) Patent No.: US 9,583,189 B2
(45) Date of Patent: Feb. 28, 2017

(54) MEMORY DEVICE, OPERATING AND CONTROL METHOD THEREOF

(71) Applicant: SAMSUNG ELECTRONICS CO., LTD., Suwon-si, Gyeonggi-Do (KR)

(72) Inventors: Pil-Sang Yoon, Hwaseong-Si (KR); Eun-Chu Oh, Hwaseong-Si (KR); Jun-Jin Kong, Yongin-Si (KR); Hong-Rak Son, Anyang-Si (KR); Dong-Min Shin, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/012,881

(22) Filed: Feb. 2, 2016

(65) Prior Publication Data

US 2016/0232971 A1    Aug. 11, 2016

(30) Foreign Application Priority Data

Feb. 6, 2015    (KR) .................. 10-2015-0018866

(51) Int. Cl.
G11C 29/00    (2006.01)
G11C 13/00    (2006.01)

(52) U.S. Cl.
CPC ........ *G11C 13/0097* (2013.01); *G11C 13/004* (2013.01); *G11C 13/0069* (2013.01)

(58) Field of Classification Search
None
See application file for complete search history.

(56) References Cited

U.S. PATENT DOCUMENTS

| | | |
|---|---|---|
| 7,916,515 B2 | 3/2011 | Li et al. |
| 8,423,866 B2 | 4/2013 | Dusija et al. |
| 8,537,596 B2 | 9/2013 | Ordentlich et al. |
| 8,711,610 B2 | 4/2014 | Seo et al. |
| 2010/0095052 A1 | 4/2010 | Chen et al. |
| 2011/0305067 A1 | 12/2011 | Ueda |
| 2012/0294092 A1* | 11/2012 | Cho ............... G11C 11/406 365/185.22 |
| 2013/0198440 A1 | 8/2013 | Oh et al. |
| 2014/0016397 A1 | 1/2014 | Lee et al. |
| 2014/0269069 A1 | 9/2014 | D'Abreu et al. |

* cited by examiner

*Primary Examiner* — Vu Le
(74) *Attorney, Agent, or Firm* — Volentine & Whitt, PLLC

(57) ABSTRACT

A method of operating a memory device including a plurality of memory cells is provided. The method includes receiving a first write command, determining whether a target memory cell is deteriorated or not, in response to the first write command, and writing the second data by selectively erasing the target memory cell according to a result of the determination and by programming the target memory cell.

20 Claims, 17 Drawing Sheets

MEMORY DEVICE, OPERATING AND CONTROL METHOD THEREOF

CROSS-REFERENCE TO RELATED APPLICATION

This application claims the benefit of Korean Patent Application No. 10-2015-0018866, filed on Feb. 6, 2015, in the Korean Intellectual Property Office, the disclosure of which is incorporated herein in its entirety by reference.

BACKGROUND

The inventive concept relates to a memory device, and more particularly, to a memory device supporting an overwrite operation, a method of operating the same, and a method of controlling the same.

As memory devices have been required to have high capacitance and low power consumption, research into next generation memory devices which are non-volatile without a need of refresh operations has been conducted. The next generation memory devices are required to have high integration of dynamic random access memory (DRAM), non-volatile properties of flash memory, and a high speed of static RAM (SRAM). As next generation memory devices that satisfy the above-described requirements, phase change RAM (PRAM), nano floating gate memory (NFGM), polymer RAM (PoRAM), magnetic RAM (MRAM), ferroelectric RAM (FeRAM), resistive RAM (RRAM), etc. are mentioned.

SUMMARY

The inventive concept provides a memory device that may increase the reliability of write data, a method of operating the same, and a method of controlling the same.

According to an aspect of the inventive concept, there is provided a method of operating a memory device including a plurality of memory cells, the method including receiving a first write command for writing second data in a target memory cell having a first state corresponding to first data, determining whether the target memory cell is deteriorated based on the first state, in response to the first write command, and writing the second data by selectively erasing the target memory cell according to a result of the determination and by programming the target memory cell to have a second state corresponding to the second data.

According to another aspect of the inventive concept, there is provided a method of controlling a memory device including a plurality of memory cells, the method including receiving a write request for writing second data in a target memory cell having a first state corresponding to first data, determining whether the target memory cell is deteriorated in response to the write request, when the target memory cell is deteriorated, transmitting a first command to the memory device, and when the target memory cell is not deteriorated, transmitting a second command that differs from the first command to the memory device, wherein the first command and the second command are accompanied by an address corresponding to the target memory cell.

According to another aspect of the inventive concept, there is provided a memory device including a memory cell array having a plurality of memory cells, a write/read circuit configured to perform write and read operations on memory cells included in a memory cell group of the memory cell array, and configured to output a signal indicating whether a state of each of the memory cells in the memory cell group is in a read margin range, and a control logic configured to determine whether the memory cell group is deteriorated based on the signal that is output by the write/read circuit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
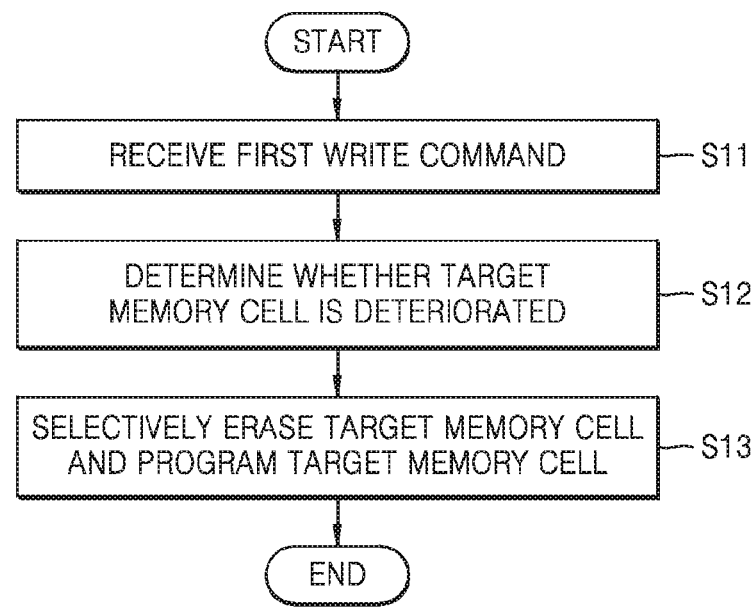
FIG. 1 is a flowchart of a method of operating a memory device, according to an exemplary embodiment.

Hereinafter, the inventive concept will now be described more fully with reference to the accompanying drawings, in which exemplary embodiments of the inventive concept are shown. Like reference numerals in the drawings denote like elements, and a repeated explanation will not be given of overlapping features. Expressions such as "at least one of," when preceding a list of elements, modify the entire list of elements and do not modify the individual elements of the list. As used herein, the term "and/or" includes any and all combinations of one or more of the associated listed items. These inventive concepts may, however, be embodied in different forms and should not be construed as limited to the embodiments set forth herein. Rather, these embodiments are provided so that this disclosure is thorough and complete and fully conveys the inventive concept to those skilled in the art. It should be understood that exemplary embodiments of the inventive concept are to cover all modifications, equivalents, and alternatives falling within the spirit and scope of the inventive concept. In the attached drawings, sizes of structures may be exaggerated for clarity.

The terminology used herein is for describing particular embodiments and is not intended to be limiting of exemplary embodiments. As used herein, the singular forms "a," "an," and "the," are intended to include the plural forms as well, unless the context clearly displays otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meanings as commonly understood in the art to which the exemplary embodiments belong. It will be further understood that the terms such as those defined in commonly used dictionaries should be interpreted as having meanings consistent with their meanings in the context of the relevant art and will not be interpreted in an idealized or overly formal sense unless expressly so defined herein.

FIG. 1 is a flowchart of a method of operating a memory device, according to an exemplary embodiment. The memory device may include a plurality of memory cells, each of which may have at least two states. Each state may correspond to written data. According to an exemplary embodiment, the memory device may support an overwrite operation. That is, the memory device may support a write command for writing second data in a memory cell in which first data is written.

The method of operating the memory device according to an exemplary embodiment includes selectively erasing memory cells based on a deterioration of the memory cells, when writing data, thereby improving the reliability of the written data. The deterioration of the memory cell may refer to a phenomenon having a possibility of reading different data from the written data from the memory cell, due to a change in a state of a memory cell corresponding to the written data. Memory cells may be deteriorated due to various factors, for example, a memory cell may be deteriorated due to changes in states of adjacent memory cells, or due to the cumulative number of read and/or write operations with respect to the memory cell.

As illustrated in FIG. 1, the memory device may receive a first write command from, for example, an external source, in operation S11. For example, the first write command may be a command for writing second data in a target memory cell currently having a first state corresponding to first data. The first and second data may be the same, or may be different from each other.

According to an exemplary embodiment, the memory device may determine whether the target memory cell is deteriorated in response to the first write command, in operation S12. For example, it may be determined whether the target memory cell is deteriorated based on the first state that the target memory cell has. Detailed aspects with respect to the determination of whether the target memory cell is deteriorated will be described later by referring to FIGS. 9 and 10.

According to an exemplary embodiment, the memory device may selectively erase the target memory cell and program the target memory cell, according to whether the target memory cell is deteriorated, in operation S13. For example, when it is determined that the target memory cell is deteriorated (that is, when there is a possibility that the first data corresponding to the first state may be different from the data when it was written, since the target memory cell is deteriorated), the memory device may erase the target memory cell. Erasing may refer to applying an electrical signal to a memory cell so that the memory cell has a predetermined state, such as an erased state (or a reset state), from among states which the memory cell can have. According to an exemplary embodiment, the target memory cell may have an erased state, since the deteriorated target memory cell is erased. Then, the target memory cell may be programmed to have a second state corresponding to the second data. Programming may refer to applying an electrical signal to a memory cell so that the memory cell has a state corresponding to data that is to be written, from among the states which the memory cell can have. The erasing and the programming may refer to applying electrical signals so that a memory cell has a predetermined state, such as a state included in a predetermined distribution of states. Accordingly, the deteriorated memory cell may be transited from the first state to the erased state, and then transited from the erased state to the second state. Thus, a distribution having an expanded width that the deteriorated target memory cell has may be restored, due to the transition to the erased state, and thus, the reliability of the written data may be improved.

According to an exemplary embodiment, when it is determined that the target memory cell is not deteriorated, the target memory cell may be programmed to have the second state corresponding to the second data. Thus, the memory cell which is not deteriorated may be transited from the first state to the second state. For example, when it is determined that the target memory cell is not deteriorated, the first data and the second data may be compared with each other, and only when the first data and the second data are different from each other, the target memory cell may be programmed to have the second state. Accordingly, unnecessary operations with respect to the memory cell may be reduced, and thus, a decrease in a lifespan of the memory cell may be prevented. Also, an overwrite operation may be stably performed in a memory device, and thus, additional processing for the maintenance of the memory device may be omitted.

Figure 2:
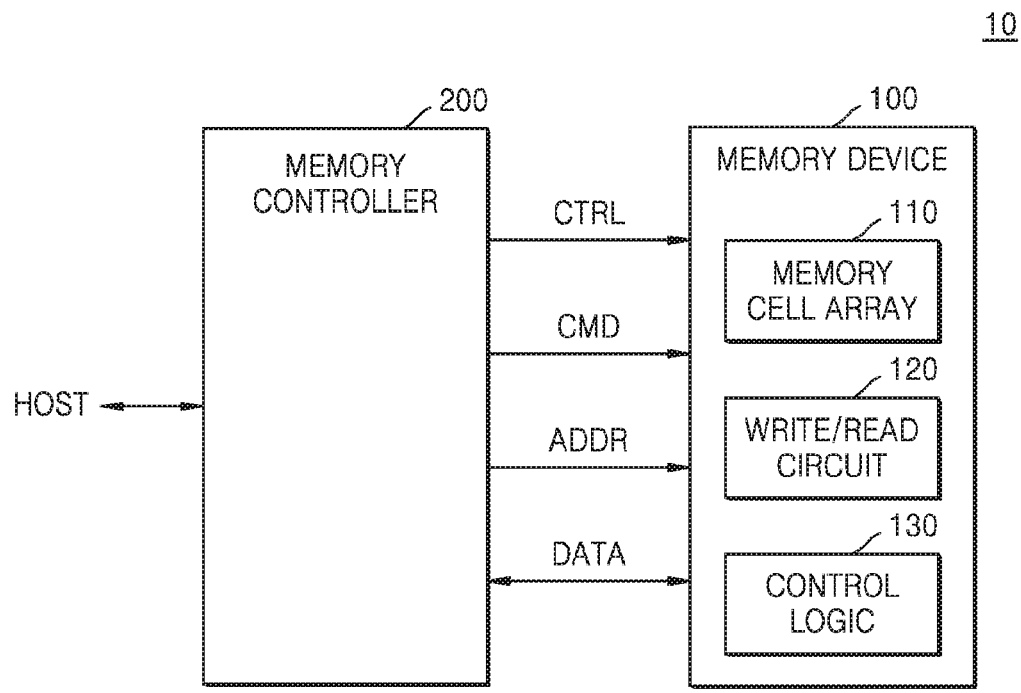
FIG. 2 is a block diagram of a memory system including a memory device and a memory controller, according to an exemplary embodiment.

FIG. 2 is a block diagram of a memory system 10 including a memory device 100 and a memory controller 200, according to an exemplary embodiment. According to an exemplary embodiment, since the memory device 100 includes resistive memory cells, the memory device 100 may be referred to as a resistive memory device. Also, according exemplary embodiments, the memory device 100 may include various kinds of memory cells, which may be arranged in an area in which a plurality of first signal lines and a plurality of second signal lines cross each other, thereby being referred to as a cross-point memory device. Hereinafter, the memory device 100 is described as the cross-point memory device including resistive memory cells. However, an inventive concept is not limited thereto.

As illustrated in FIG. 2, the memory system 10 may include the memory device 100 and the memory controller 200. The memory controller 200 may provide an address ADDR, a command CMD, and a control signal CTRL to the memory device 100, and data DATA, which is to be written in the memory device 100 or which is read from the memory device 100, may be exchanged between the memory controller 200 and the memory device 100.

The memory controller 200 may control the memory device 100 such that data accompanying a write request is written in the memory device 100 in response to the write quest from a host, or data that is stored in the memory device 100 is read from the memory device 100 in response to a read request. In detail, the memory controller 200 may transmit the address ADDR, the command CMD, and the control signal CTRL, thereby controlling write (or program), read, and erase operations with respect to the memory device 100.

Although it is not illustrated in FIG. 2, the memory controller 200 may include random access memory (RAM), a processing unit, a host interface, and a memory interface. The RAM may be used as data memory of the processing unit. The processing unit may control an operation of the memory controller 200. The host interface may support a protocol for performing a data exchange between the host and the memory controller 200. For example, the memory controller 200 may be configured to communicate with an external device (for example, the host) via at least one of various interface protocols, such as universal serial bus (USB), multimedia card (MMC), peripheral component interconnect express (PCI-E), advanced technology attachment (ATA), serial-ATA, parallel-ATA, small computer system interface (SCSI), earth science data interface (ESDI), integrated drive electronics (IDE), etc.

The memory device 100 may include a memory cell array 110, a write/read circuit 120, and a control logic 130. Since the memory cell array 110 includes a plurality of resistive memory cells, the memory system 10 may be referred to as a resistive memory system.

The memory cell array 100 may include a plurality of memory cells arranged respectively in areas in which a plurality of first signal lines and a plurality of second signal lines cross each other. According to exemplary embodiments, the plurality of first signal lines and the plurality of second signal lines may be referred to as a plurality of bit lines and a plurality of word lines, respectively, or vice versa. Also, according to an exemplary embodiment, the memory cell array 110 may include a plurality of memory cells having a two-dimensional horizontal structure, or a plurality of memory cells having a three-dimensional vertical structure.

According to exemplary embodiments, each of the plurality of memory cells may be a single level cell (SLC) storing one bit, or a multi-level cell (MLC) storing data of at least two bits. Alternatively, the memory cell array 110 may include both SLCs and MLCs. When the memory cell stores one bit, the memory cell may have two separate resistance distributions. Likewise, when the memory cell stores data of two bits, the memory cell may have four separate resistance distributions, and when the memory cell is a triple level cell (TLC) storing data of three bits, the memory cell may have eight separate resistance distributions. According to an exemplary embodiment, the memory cell included in the memory cell array 110 may be an SLC or an MLC.

According to an exemplary embodiment, the memory cell array 110 may include resistive memory cells including a variable resistance device. For example, when the variable resistance device includes a phase change material (for example, Ge—Sb—Te (GST)), and thus, the resistance of the variable resistance device is changed according to a temperature, the memory device 100 may be referred to as PRAM. According to an exemplary embodiment, when the variable resistance device includes an upper electrode, a lower electrode, and complex metal oxide between the upper electrode and the lower electrode, the memory device 100 may be referred to as RRAM. According to an exemplary embodiment, when the variable resistance device includes an upper electrode of a magnetic substance, a lower electrode of the magnetic substance, and a dielectric between the upper electrode and the lower electrode of the magnetic substance, the memory device 100 may be referred to as MRAM.

The write/read circuit 120 may perform write and read operations with respect to the memory cells included in the memory cell array 110. The write/read circuit 120 may be connected to the memory cells via the plurality of bit lines, and may include a write driver for writing data in the memory cells and a sensing amplifier for sensing resistive properties of the memory cells. Also, the write/read circuit 120 may include a latch unit including a plurality of latches. The latch unit may temporarily store data that is read from the memory cells included in the memory cell array 110 or data that is to be written in the memory cells.

According to an exemplary embodiment, the write/read circuit 120 may include a bitwise operation circuit. The bitwise operation circuit may generate an output signal by performing a bitwise operation of an output signal of the sensing amplifier included in the write/read circuit 120 or that data stored in the latch unit. The output signal generated by the bitwise operation circuit may indicate a state of a memory cell included in the memory cell array 110 or a result of comparing data stored in the memory cell and data that is to be written in the memory cell. Accordingly, the output signal of the bitwise operation circuit may be used for the control logic 130 to determine whether a memory cell included in the memory cell array 110 is deteriorated or not, or to omit a program operation of the memory cell or not.

The control logic 130 may control overall operations of the memory device 100, and may perform write and read operations with respect to the memory cells included in the memory cell array 110, by controlling the write/read circuit 120 in response to the command CMD and/or the control signal CTRL received from the outside of the memory device 100. For example, the memory device 100 may include a reference signal generating unit for generating a plurality of reference signals used in the write operation, such as a reference current and/or a reference voltage. The control logic 130 may adjust levels of the reference signals by controlling the reference signal generating unit.

With respect to the write operation of the memory device 100, the variable resistance device of the memory cell included in the memory cell array 110 may have a resistance that may be increased or decreased according to the data that is to be written. For example, the memory cell included in the memory cell array 110 may have a first resistance (or a first state) according to the data that is currently stored, and then the first resistance may be increased or decreased according to the data to be written to a second resistance (or a second state) corresponding to the data that is to be written. Such a write operation may be divided into a reset write operation and a set write operation. In a resistive memory cell, a set state may correspond to a relatively low resistance, and a reset state may correspond to a relatively high resistance. According to an exemplary embodiment, the reset state may correspond to an erased state, and in this case, the memory cell storing data of at least two bits may have a plurality of separate distributions of resistances in which the set state is included.

According to an exemplary embodiment, the memory device 100 and the memory controller 200 may be integrated in one semiconductor device. For example, the memory device 100 and the memory controller 200 may form a memory card as a semiconductor device. That is, the memory device 100 and the memory controller 200 may form a PC card (PCMCIA card), a compact flash card (CF), a smart media card (SM/SMC), a memory stick, a multimedia card (MMC, RS-MMC, and MMCmicro), an SD card (SD, miniSD, and microSD), a universal flash memory device (UFS), etc. According to an exemplary embodiment, the memory device 100 and the memory controller 200 are integrated in one semiconductor device, and thus, the memory device 100 may form a solid state disk/drive (SSD).

Figure 3:
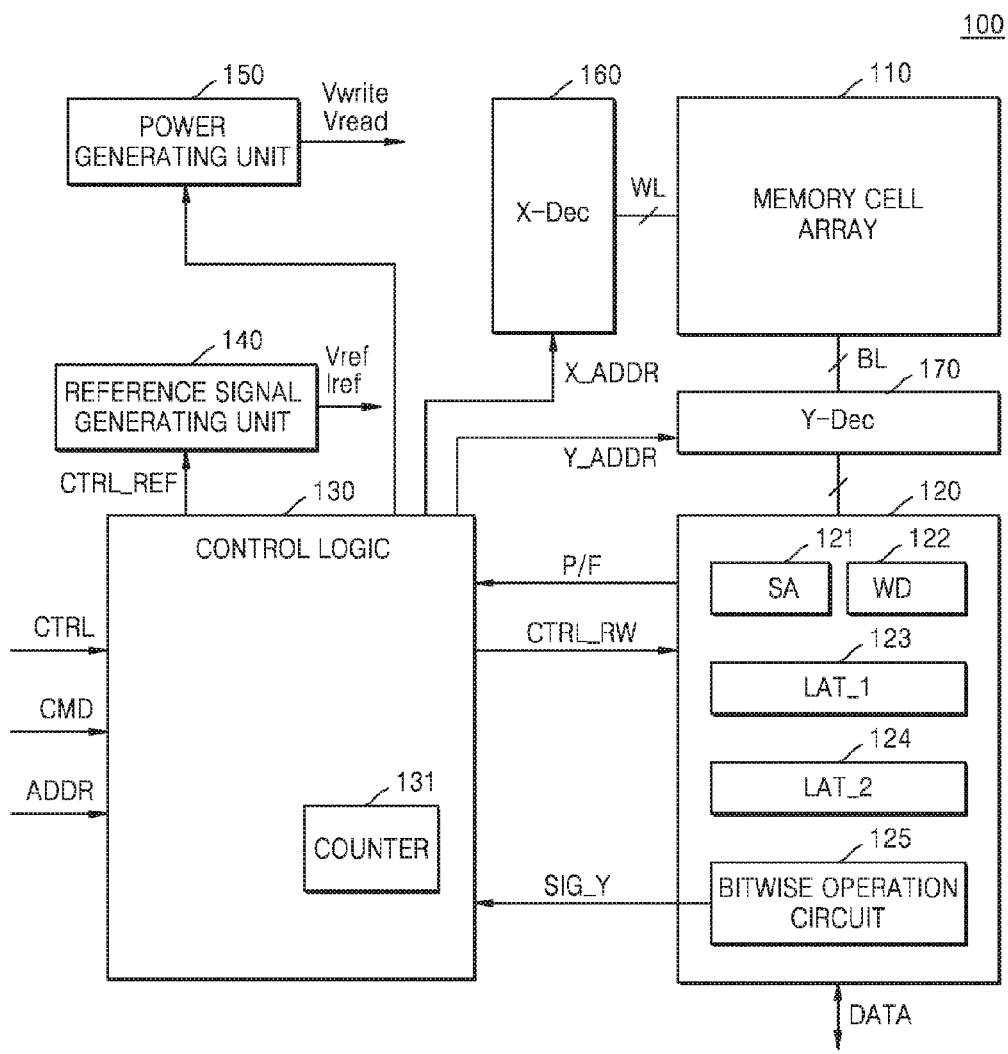
FIG. 3 is a schematic block diagram of an exemplary embodiment of the memory device of FIG. 1.

FIG. 3 is a block diagram of an exemplary embodiment of the memory device 100 of FIG. 1. As illustrated in FIG. 3, the memory device 100 may include the memory cell array 110, the write/read circuit 120, and the control logic 130. Also, the memory device 100 may further include a reference signal generating unit 140, a power generating unit 150, a row decoder 160, and a column decoder 170. The write/read circuit 120 may include a sensing amplifier 121, a write driver 122, first and second latch units 123 and 124, and a bitwise operation circuit 125. The control logic 130 may include a counter 131.

A plurality of memory cells included in the memory cell array 110 may be connected to a plurality of first signal lines and a plurality of second signal lines. The plurality of first signal lines may be bit lines BLs and the plurality of second signal lines may be word lines WLs. Various voltages and currents may be provided via the plurality of bit lines BLs and the plurality of word lines WLs so that data may be written in or read from a selected memory cell from among the plurality of memory cells, while the write or read operation may be prevented in a non-selected memory cell.

An address ADDR for designating a memory cell to access may be received with a command CMD, and the address ADDR may include a row address X_ADDR for selecting the word lines WLs of the memory cell array 110 and a column address Y_ADDR for selecting the bit lines BLs of the memory cell array 110. The row decoder 160 may perform a word line selection operation in response to the row address X_ADDR and the column decoder 170 may perform a bit line selection operation in response to the column address Y_ADDR.

The write/read circuit 120 may be connected to the bit lines BLs, and may write data in the memory cell included in the memory cell array 110 or read data from the memory cell included in the memory cell array 110. For example, the power generating unit 150 may generate a write voltage Vwrite for a write operation and a read voltage Vread for a read operation. The write voltage Vwrite may include a set voltage and a reset voltage with respect to the write operation and the read voltage Vread may include a bit line voltage, a precharge voltage, and a clamping voltage with respect to the read operation. The write voltage Vwrite and the read voltage Vread may be provided to the bit lines BLs via the write/read circuit 120 or to the word lines WLs via the row decoder 160.

During the write or read operation, the write/read circuit 120 may determine data based on a state determined via the sensing amplifier 121, and based on the determined data, may notify the control logic 130 whether the write or read operation has succeeded as a pass/fail signal P/F. The control logic 130 may control the write and read operations of the memory cell array 110 based on the pass/fail signal P/F.

As illustrated in FIG. 3, the write/read circuit 120 may include the bitwise operation circuit 125, and the first and second latch units 123 and 124. The first and second latch units 123 and 124 each may temporarily store data corresponding to at least one memory cell, and the bitwise operation circuit 125 may perform a bitwise operation of an output signal of the sensing amplifier 121 or data stored in the first and second latch units 123 and 124, and may generate an output signal SIG_Y. For example, the first latch unit 123 may store data stored in at least one memory cell included in the memory cell array 110, based on the output signal of the sensing amplifier 121, the second latch unit 124 may store data that is to be stored in at least one memory cell included in the memory cell array 110, and the bitwise operation circuit 125 may perform an XOR operation of the data stored in the first latch unit 123 and the data stored in the second latch unit 124.

According to a control of the control logic 130, the output signal SIG_Y of the bitwise operation circuit 125 may indicate a state of the memory cell included in the memory cell array 110 or may indicate a result of comparing the data stored in the memory cell with the data to be written in the memory cell. The output signal SIG_Y of the bitwise operation circuit 125 may be transmitted to the control logic 130. The output signal SIG_Y of the bitwise operation circuit 125 may be used for omitting a program operation with respect to a memory cell or for determining whether a memory cell is deteriorated via the control logic 130. According to an exemplary embodiment, the bitwise operation circuit 125 may include a plurality of XOR gates, and input signals of the plurality of XOR gates may include an output signal of the first latch unit 123 and an output signal of the second latch unit 124.

The reference signal generating unit 140 may generate a reference signal used for sensing a state that a memory cell included in the memory cell array 110 has, according to the control of the control logic 130. For example, the reference signal generating unit 140 may generate a reference voltage Vref or a reference current Iref. For example, the sensing amplifier 121 may be connected to a node (for example, a sensing node) of the bit line BL to determine the state that the memory cell has, and a voltage of the sensing node and the reference voltage Vref may be compared with each other to determine the state that the memory cell has. Alternatively, the state that the memory cell has may be determined by comparing the reference voltage Vref and the voltage of the sensing node which results from the reference current Iref.

According to an exemplary embodiment, the reference signal generating unit 140 may sequentially generate reference signals having different levels in order to sense a state that a memory cell has, according to the control of the control logic 130. For example, the control logic 130 may control the reference signal generating unit 140 such that the reference signal generating unit 140 may sequentially generate the reference signals having different levels, to determine whether the state that the memory cell has is included in a predetermined range. Accordingly, the control logic 130 may determine whether the memory cell is deteriorated based on the state of the memory cell that is sensed.

The control logic 130 may generate signals for controlling other components included in the memory device 100, based on the command CMD, the address ADDR, and the control signal CTRL that are received from the memory controller 200. For example, the control logic 130 may generate a control signal CTRL_RW for controlling the write/read circuit 120, and may generate a control signal CTRL_REF for controlling the reference signal generating unit 140.

The control logic 130 may determine whether a memory cell included in the memory cell array 110 is deteriorated based on a signal SIG_Y received from the write/read circuit 120. For example, when the memory device 100 receives a first write command, the control logic 130 may determine whether a state of a memory cell that is a target of the first write command is in a predetermined range (for example, a read margin range), based on the output signal SIG_Y of the bitwise operation circuit 125, and may determine that the memory cell having the state included in the predetermined range is deteriorated. As another example, with respect to a memory cell group including the memory cell that is the target of the first write command, the bitwise operation circuit 125 may include the counter 131 for counting the number of memory cells in which the output signal SIG_Y of the bitwise operation circuit 125 is indicated, and when the output value of the counter 131 is equal to or higher than a predetermined reference value, it may be determined that the memory cell group is deteriorated.

The reference value may be set by receiving a set command from the outside of the memory device 100. According to an exemplary embodiment, the output value of the counter 131 may be transmitted externally from the memory device 100, and the memory controller 200 may receive the output value of the counter 131 and determine whether the memory cell group is deteriorated or not based on the output value.

FIG. 3 illustrates the memory device 100 including the counter 131. However, an external component of the memory device 100 such as the memory controller 200 of FIG. 2, may include a component that counts the number of memory cells having a state included in a predetermined range, according to exemplary embodiments. Referring to FIG. 1, the memory device 100 may transmit information about a memory cell included in the memory cell array 110 of the memory device 100 to the memory controller 200, in response to a command CMD received from the memory controller 200, and a counter included in the memory controller 200 may count the number of memory cells that are determined to be deteriorated based on the information about the memory cell received from the memory device 100. Also, when the output value of the counter is equal to or higher than a predetermined reference value, the memory controller 200 may control the memory device 100 to erase the memory cells determined to be deteriorated. Detailed aspects with respect to the memory controller 200 including the counter will be described with reference to FIGS. 11 and 14.

Figure 4:
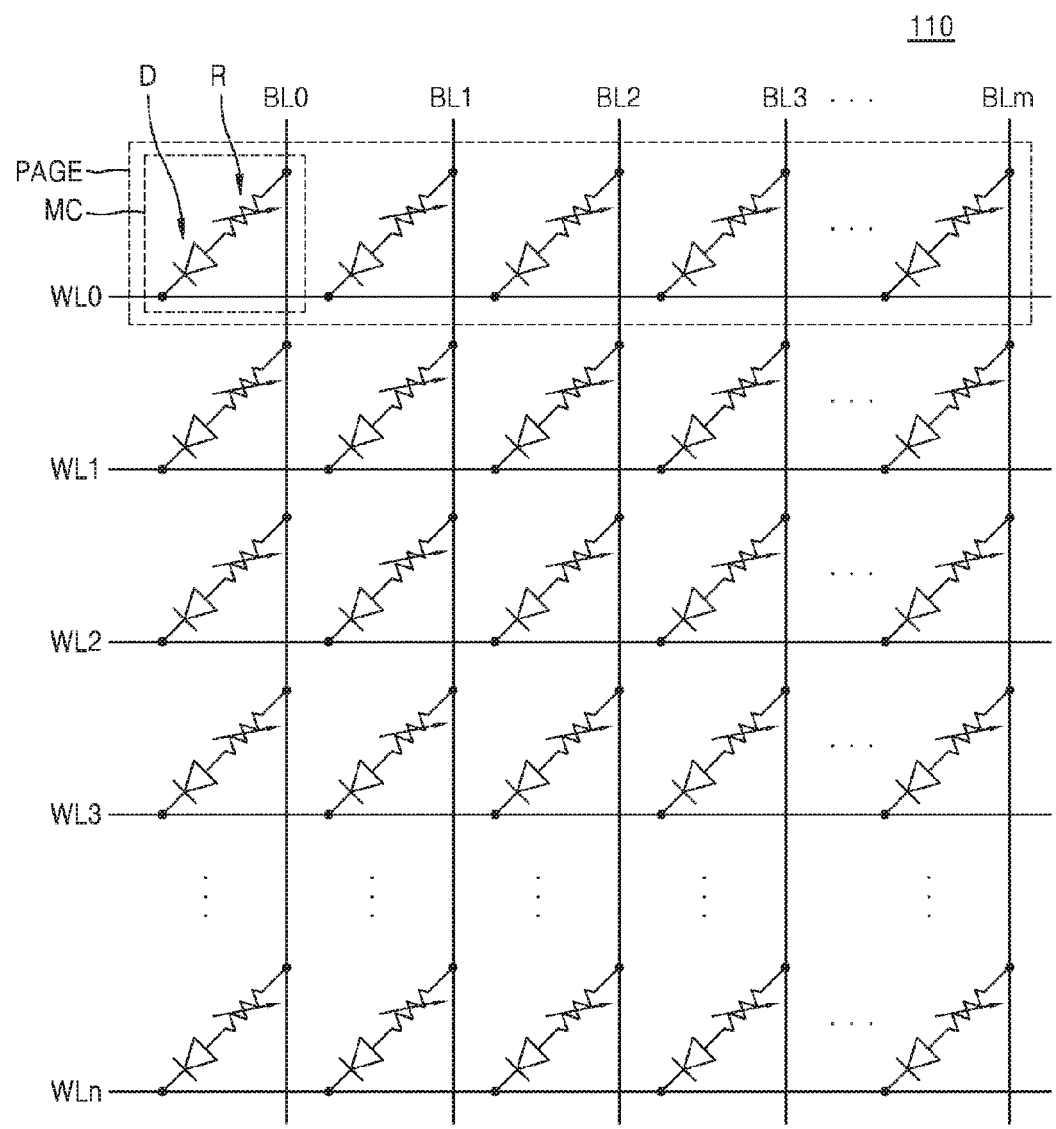
FIG. 4 is a circuit diagram of an exemplary embodiment of a memory cell array of FIG. 3.

FIG. 4 is a circuit diagram of an exemplary embodiment of the memory cell array 110 of FIG. 3. The memory cell array 110 may include a plurality of cell blocks, and FIG. 4 may illustrate one cell block.

As illustrated in FIG. 4, the memory cell array 110 may include a plurality of word lines WL0 to WLn, a plurality of bit lines BL0 to BLm, and a plurality of memory cells MCs. Here, the number of the word lines WLs, the number of the bit lines BLs, and the number of the memory cells MCs may vary according to exemplary embodiments. Also, the memory cells MCs connected to the same word line may be defined as a page. Referring to FIG. 3 together, data stored in the memory cell array 110 may be written or read in a page unit via the write/read circuit 120, or may be written or read in a unit (for example, a unit of a cell) that is smaller than the page unit.

Each of the plurality of memory cells MCs may include a variable resistor R and a selection device D. Here, the variable resistor R may be referred to as a variable resistance device or a variable resistance material, and the selection device D may be referred to as a switching device.

According to an exemplary embodiment, the variable resistor R may be connected between one of the plurality of bit lines BL0 to BLm and the selection device D, and the selection device D may be connected between the variable resistor R and one of the plurality of word lines WL0 to WLn. However, the present inventive concept is not limited thereto. The selection device D may be connected between one of the plurality of bit lines BL0 to BLm and the variable resistor R, and the variable resistor R may be connected between the selection device D and one of the plurality of word lines WL0 to WLn.

The variable resistor R may be changed to one of a plurality of resistance states, due to an electrical pulse applied to the variable resistor R. For example, the variable resistor R may include a phase-change material, a crystal state of which changes according to an amount of currents. The phase-change material may include various types of materials, such as GaSb, InSb, InSe, $Sb_2Te_3$, and GeTe in which two elements are combined, GeSbTe, GaSeTe, InSbTe, $SnSb_2Te_4$, and InSbGe in which three elements are combined, and AgInSbTe, (GeSn) SbTe, GeSb (SeTe), and $Te_{81}Ge_{15}Sb_2S_2$ in which four elements are combined. The phase-change material may have an amorphous state having a relatively high resistance and a crystal state having a relatively low resistance. The phase-change material may change its phase due to Joule's heat generated according to an amount of current. Also, the phase-change material may store data by using the phase-change. As another example, the variable resistor R may include perovskite compounds, transition metal oxide, magnetic materials, ferromagnetic materials, or antiferromagnetic materials, instead of the phase-change material.

As illustrated in FIG. 4, the selection device D may be connected between one the plurality of word lines WL0 to WLn and the variable resistor R, and may control a current supply to the variable resistor R according to a voltage applied to the connected word line and the bit line. For example, the selection device D may be a PN junction or a PIN junction diode, and an anode of the diode may be connected to the variable resistor R and a cathode of the diode may be connected to one of the plurality of word lines WL0 to WLn. Here, when a voltage difference between the anode and the cathode of the diode becomes higher than a threshold voltage of the diode, the diode becomes turned on so that a current may be supplied to the variable resistor R.

Figure 5:
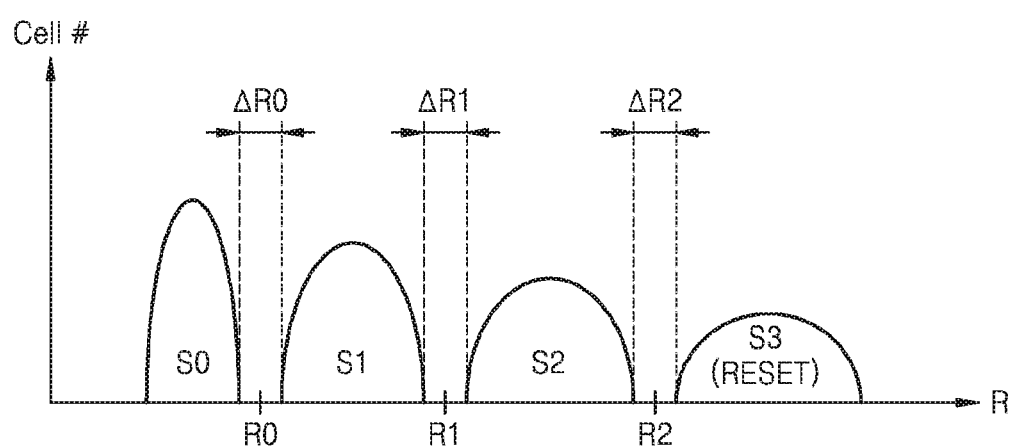
FIG. 5 is a graph of an example of a distribution of resistance values of multi-level cells.

FIG. 5 is a graph illustrating an example of a resistance distribution of multi-level cells. In detail, FIG. 5 illustrates an example in which each of the multi-level cells stores data of two bits, and the multi-level cells have four distinctive resistance distributions S0 through S3. In the graph of FIG. 5, a horizontal axis indicates a resistance and a vertical axis indicates the number of memory cells. As illustrated in FIG. 5, the distribution S0 may have a resistance value having the smallest resistance level, and the distributions S1 through S3 may have a relatively higher resistance value than the distribution S0. Memory cells included in the distributions S0 through S2 may be referred to as having a set state and memory cells included in the distribution S3 may be referred to as having a reset state. Due to a characteristic of a resistive memory cell, a width of the resistance distribution may be decreased by a verification operation when writing data, and a width of the resistance distribution in the set state may be smaller than a width of the resistance distribution in the reset state.

The resistive memory cell may support an overwrite operation. That is, referring to FIG. 4, the resistive memory cell may be transited from a current state to another state by adjusting a strength and a direction of a current flowing to the variable resistor R. For example, when the resistive memory cell has a state included in the distribution S1, the resistive memory cell may be transited to a state included in one of the distributions S0, S2, and S3, via programming, according to overwrite data. In particular, a transition into the reset state included in the distribution S3 may be referred to as an erase operation, and a reset state may be referred to as an erase state.

As illustrated in FIG. 5, states that memory cells have may be determined by referring to reference resistance values R0, R1, and R2. In other words, the distributions S0 through S3 may be separated by the reference resistances R0, R1, and R2. As a resistance of the resistive memory cell is proximate to the reference resistances R0, R1, and R2, it may become difficult to determine the state of the resistive memory cell, and thus, data read from a memory cell having the resistance proximate to the reference resistances R0, R1, and R2 may have a relatively high probability of including errors. As indicated as ΔR0, ΔR1, and ΔR2 in FIG. 5, a range proximate to the reference resistance values R0, R1, and R2 may be referred to as a read margin range, and the read margin range may be defined by the reference resistances used in a verify operation. When a resistance of a memory cell is in the read margin range, data read from the memory cell may have a relatively high probability of including errors.

Figure 6:
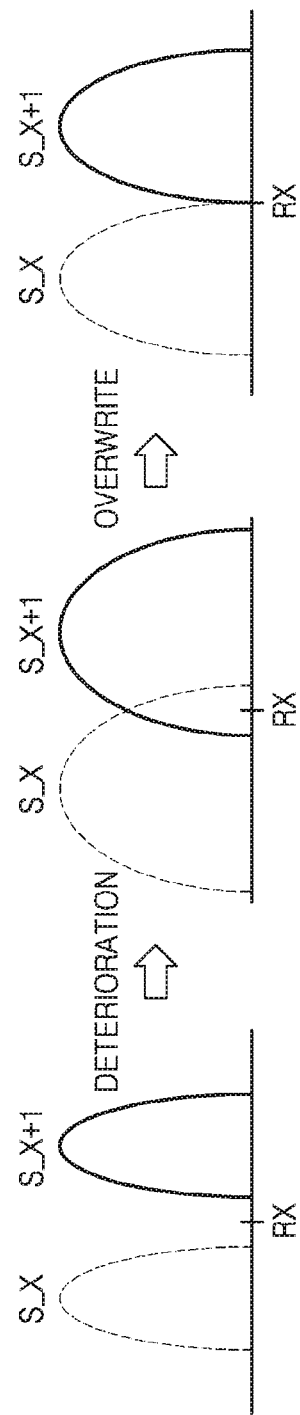
FIG. 6 is a diagram illustrating an effect caused by a deterioration of a memory cell during an overwrite operation.

FIG. 6 is a view illustrating influence of a deterioration of a memory cell on an overwrite operation. FIG. 6 illustrates two resistance distributions S_X and S_X+1 which are adjacent to each other in memory cells. In detail, a graph on the left side indicates resistance distributions of memory cells after a write operation (or a verification operation), a graph in the middle indicates resistance distributions of deteriorated memory cells, and a graph on the right side indicates resistance distributions after an overwrite operation on the deteriorated memory cell. As described above, the memory cell may be deteriorated by various factors. Accordingly, the resistance distributions of the memory cell may be proximate to a reference resistance RX for separating resistance distributions S_X and S_X+1 of the memory cells, and may even include the reference resistance RX, as illustrated in the figure in the middle in FIG. 6.

The overwrite operation of the memory cell may include comparing data that is stored and data that is to be written, and programming the memory cell only when the two sets of data are different from each other according to a result of the comparison, thereby increasing the efficiency of the overwrite operation. When the overwrite operation is performed in the deteriorated memory cell illustrated in the figure in the middle in FIG. 6, the memory cell having a resistance proximate to the reference resistance RX may maintain the state in which the memory cell has the resistance proximate to the reference resistance RX after the overwrite operation, if the data to be stored and the data which is determined based on the reference resistance RX are the same. Accordingly, as illustrated in the graph on the right side of FIG. 6, the resistance distributions S_X and S_X+1 in the memory cells on which the overwrite operation has been finished may still include memory cells included in the read margin range (that is, the range proximate to the reference resistance RX).

Figure 7:
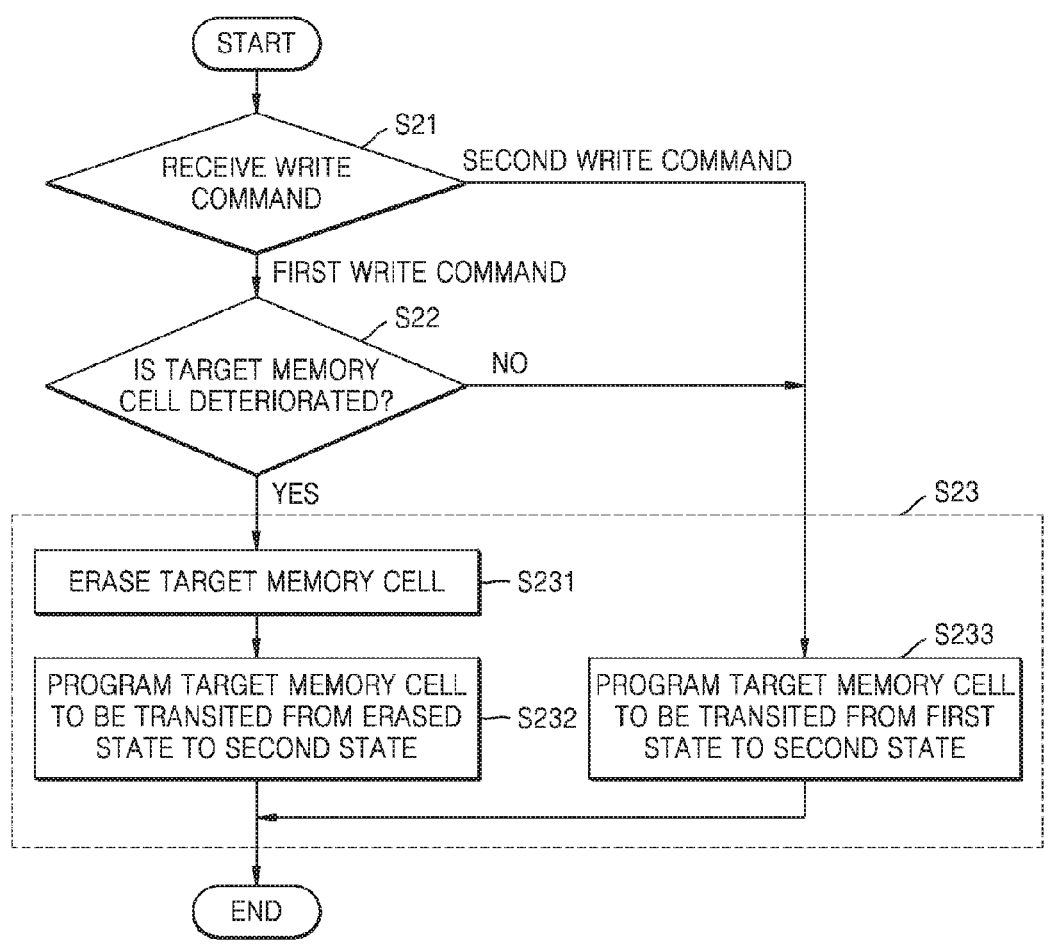
FIG. 7 is a flowchart of a method of operating a memory device, according to an exemplary embodiment.

FIG. 7 is a flowchart of a method of operating a memory device, according to an exemplary embodiment. In detail, FIG. 7 illustrates the method of operating the memory device when a write command is received. Hereinafter, FIG. 7 will be described by referring to FIG. 3 together. However, it will be understood that the method of operating the memory device according to an exemplary embodiment is not limited to the structure of the memory device 100 of FIG. 3.

As illustrated in FIG. 7, according to an exemplary embodiment, the memory device 100 may receive the write command in operation S21. For example, the control logic 130 may receive a command, and may decode the received command to determine whether the received command is a first or a second write command. The first and second write commands may be accompanied by an address ADDR with respect to a target memory cell, and may be accompanied by second data to be written in the target memory cell. The target memory cell may have a first state corresponding to first data before receiving the write command, and the write operation may be completed as the target memory cell has a second state corresponding to the second data in response to the received write command.

The write operation according to the first write command may include determining whether the target memory cell is deteriorated, and the write operation according to a second write command may perform an overwrite operation regardless of whether the target memory cell is deteriorated or not. That is, referring to FIG. 1 together, the memory controller 200 may store information for managing a plurality of memory cells included in the memory cell array 110 of the memory device 100, and may select the first or second write command to transmit to the memory device 100 by determining whether the memory cell is deteriorated according to the stored information. The memory device 100 may support the first and second write commands, thereby increasing an efficiency of the write operation in the memory system 10.

When the received write command is the first write command, the memory device 100 may perform determining whether the target memory cell is deteriorated in operation S22. For example, the control logic 130 may determine whether the target memory cell is deteriorated by controlling the write/read circuit 120 and the reference signal generating unit 140. Next, the memory device 100 may selectively erase the target memory cell according to whether the target memory cell is deteriorated and program the target memory cell in operation S23.

When the target memory cell is determined to be deteriorated, the memory device 100 may erase the target memory cell in operation S231. For example, the control logic 130 may erase the target memory cell determined to be deteriorated by controlling the write/read circuit 120, and thus, the target memory cell may have a reset state. Then, the memory device 100 may program the target memory cell to be transited from the erased state to a second state corresponding to second data, in operation S23. For example, the second latch unit 124 may store the second data that is to be written, and the write driver 122 may perform program and verify operations, based on the second data stored in the second latch unit 124, such that the target memory cell has the second state.

According to an exemplary embodiment, when the target memory cell is determined to be deteriorated, the memory device 100 may erase a memory cell group including the target memory cell. For example, the control logic 130 may erase the memory cell group including the target memory cell determined to be deteriorated, by controlling the write/read circuit 120. The memory cell group may be a page of FIG. 4, or may be larger or smaller than the page. Next, the memory device 100 may program the erased memory cell group based on group data including the second data.

When the target memory cell is not determined to be deteriorated in operation S22, or when the received write command is the second write command in operation S21, the memory device 100 may program the target memory cell to be transited directly from the first state to the second state in operation S233. For example, according to a control of the control logic 130, the first latch unit 123 may store the first data corresponding to the first state, and the second latch unit 124 may store the second data. The bitwise operation circuit 125 may compare the first data and the second data stored in the first latch unit 123 and the second latch unit 124, respectively, and the target memory cell may be programmed according to an output signal of the bitwise operation circuit 125, when the output signal indicates that the first data and the second data are different from each other.

Figure 8:
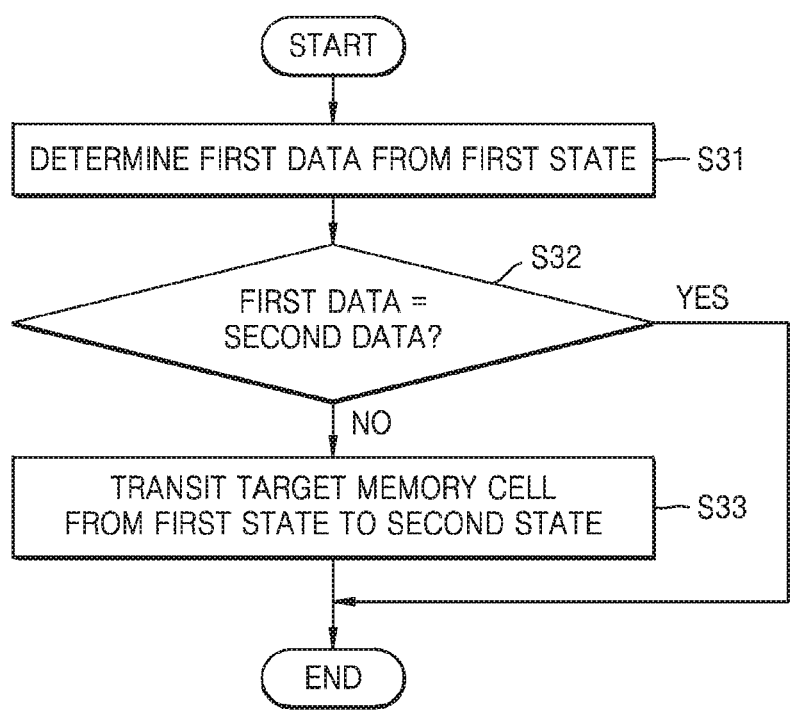
FIG. 8 is a flowchart of a method of overwriting a memory cell, according to an exemplary embodiment.
Figure 9:
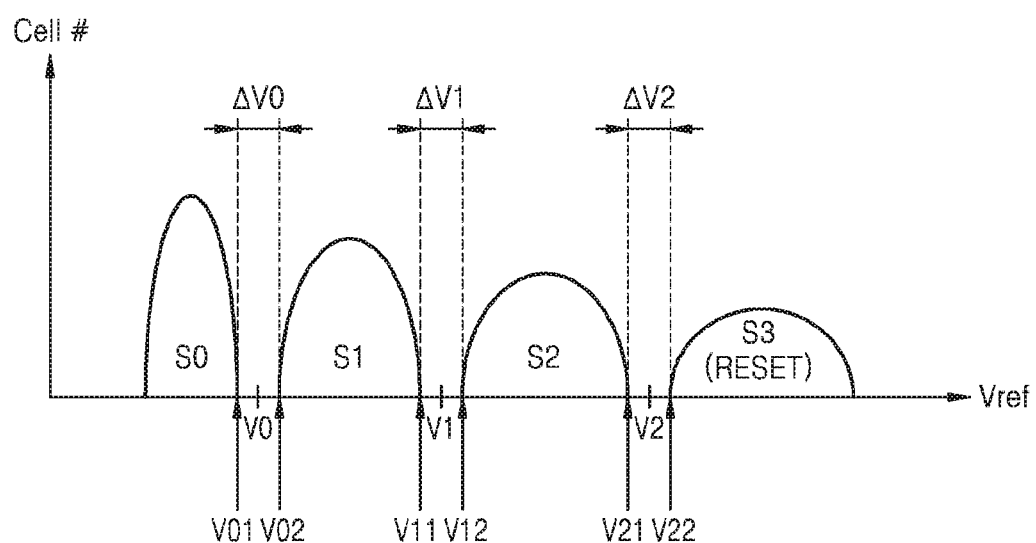
FIG. 9 is a diagram illustrating an example of a reference voltage that is applied to a sensing amplifier when a state of a memory cell is sensed.

FIG. 8 is a flowchart of a method of overwriting a memory cell, according to an exemplary embodiment, and FIG. 9 illustrates an example of a reference voltage applied to a sensing amplifier when a state of a memory cell is sensed. In detail, FIG. 8 is a flowchart illustrating in detail operation S233 of FIG. 7, and a memory cell of a graph of FIG. 9 may have four separate resistance distributions S0 through S3. Hereinafter, FIG. 8 will be described by referring to FIG. 3 together. However, it will be understood that the method of selectively programming the memory cell according to an exemplary embodiment is not limited to the structure of the memory device 100 of FIG. 3.

In operation S31, the memory device 100 may determine first data from a first state that a target memory cell has. For example, the sensing amplifier 121 may determine the first data from the first state of the target memory cell, based on a reference signal generated by the reference signal generating unit 140 according to a control of the control logic 130, and may store the first data in the first latch unit 123. Then, the memory device 100 may compare the first data and second data in operation S32. For example, the second latch unit 124 may store the second data accompanying a write command, and the bitwise operation circuit 125 connected to the first and second latch units 123 and 124 may perform a comparison operation of the first data and the second data.

According to an exemplary embodiment, the memory device 100 may sense the first state that the target memory cell has, by using a reference signal generated based on the second data, to determine whether the first data and the second data are the same. For example, the memory device 100 may sense the first state by using a reference signal corresponding to a read margin range proximate to the second state, that is, the reference signal corresponding to a boundary of the read margin range contacting a boundary of a resistance distribution corresponding to the second data. That is, as illustrated in FIG. 9, when the second data corresponds to a state S2, the memory device 100 may use reference voltages V12 and V21 instead of reference voltages V1 and V2, to sense the first state. That is, the memory device 100 may use a reference voltage used in a verify operation performed while the second data is being written, to sense the first state. Accordingly, when the target memory cell skips programming since the first data and the second data are the same, the resistance distribution may be separated from the read margin range, and thus, a width of the resistance distribution may be reduced.

When the first data and the second data are different from each other, the memory device 100 may program the target memory cell to be transited from the first state to the second state, in operation S33. For example, the write driver 122 may adjust an electrical signal applied to the target memory cell, based on the first state corresponding to the first data and the second state corresponding to the second data, to adjust a shifting direction and a shifting amount of states, so that the target memory cell may be transited to the second state.

Hereinafter, FIG. 9 will be described by referring to FIG. 3. As described above, when the state that the memory cell has is included in the read margin range, the data read from the memory cell has a relatively high probability of including errors, and thus, the memory cell included in the read margin range may be determined to be deteriorated. To determine whether the first state that the target memory cell has is in the read margin range, the state of the target memory cell may be sensed by more than two times. For example, as illustrated in FIG. 9, the reference signal generating unit 140 may apply the reference voltages V21 and V22 to the sensing amplifier 121 at two different points in time, and data sensed at the two points in time may be compared by using the bitwise operation circuit 125, and the first and second latch units 123 and 124, to determine whether the state that the memory cell has is in an range ΔV2, which is a part of the read margin range. According to an exemplary embodiment, the reference voltages V01, V02, V11, V12, V21, and V22 may refer to voltages used in the verify operation.

Figure 10:
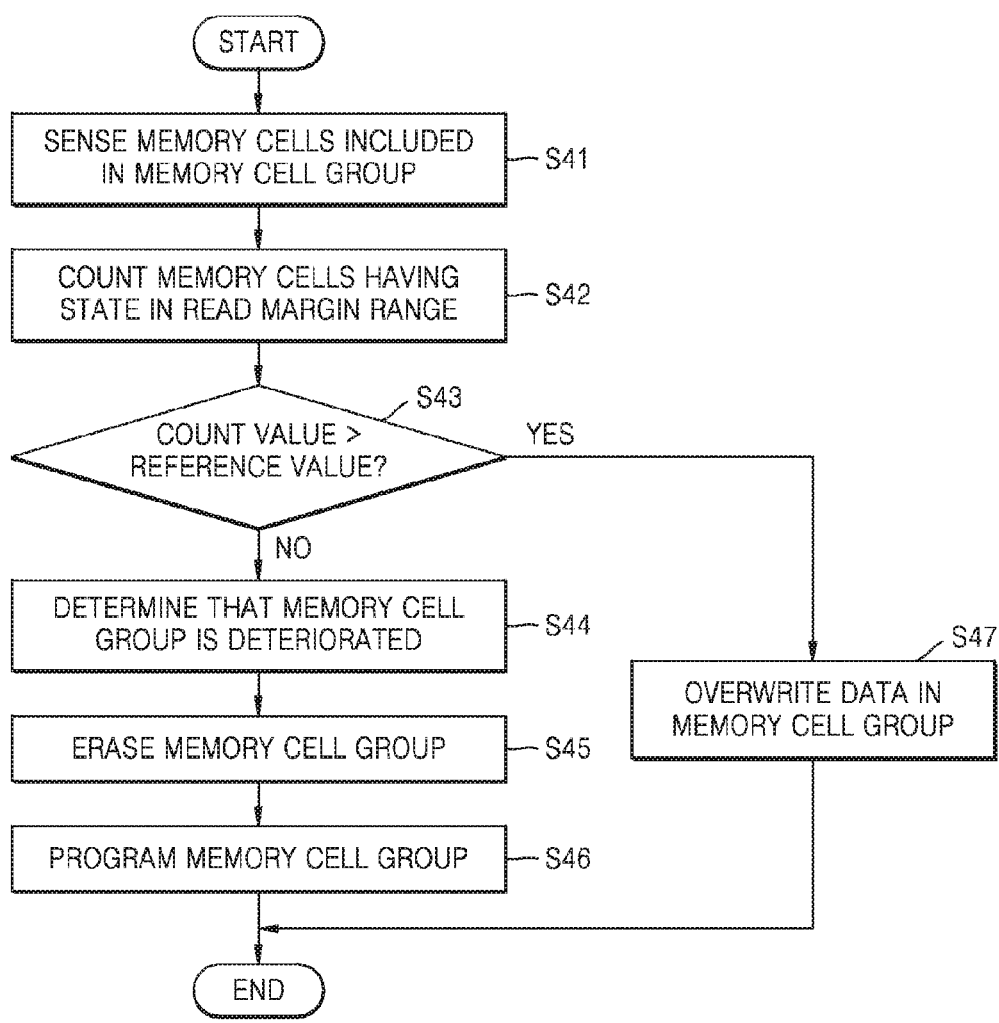
FIG. 10 is a flowchart of a method of determining whether a memory cell group including a plurality of memory cells is deteriorated or not.

FIG. 10 is a flowchart of a method of determining whether a memory cell group including a plurality of memory cells is deteriorated or not. According to an exemplary embodiment, the first write command may be a command for writing group data including second data in a memory cell group including a target memory cell. The memory cell group may be a page of FIG. 4, or may be larger or smaller than the page. According to an exemplary embodiment, the memory device may determine whether the memory cell group including the plurality of memory cells is deteriorated or not, and may selectively erase the memory cell group according to a result of the determination. Hereinafter, FIG. 10 will be described by referring to FIG. 3.

As illustrated in FIG. 10, the memory device 100 may sense the memory cells included in the memory cell group in operation S41. For example, the reference voltage generating unit 140 may generate a plurality of reference voltages at different points in time, and the sensing amplifier 121 may determine data stored in the memory cell group at each point in time, based on the plurality of reference voltages. The first and/or second latch units 123 and 124 may store the data determined by the sensing amplifier 121, and the bitwise operation circuit 125 may generate a signal indicating memory cells having a state in a read margin range, from among the memory cells included in the memory cell group, based on the data stored in the first and/or second latch units 123 and 124.

The memory device 100 may count the number of memory cells having the state in the read margin range from among the memory cells included in the memory cell group in operation S42. For example, the control logic 130 may receive an output signal SIG_Y of the bitwise operation circuit 125, and the counter 131 may count the number of memory cells having the state in the read margin range, based on the output signal SIG_Y of the bitwise operation circuit 125.

The memory device 100 may compare the counted value and a reference value in operation S43. The reference value may be configured by receiving a configuration command from outside of the memory device 100. For example, the memory controller 200 of FIG. 2 may transmit the configuration command to the memory device 100 to configure the reference value when necessary.

When the counted value exceeds the reference value, the memory device 100 may determine that the memory cell group including the memory cells is deteriorated in operation S44, and may erase the memory cells included in the memory cell group in operation S45. Then, the memory device 100 may program the memory cell group based on the group data in operation S46.

When the counted value does not exceed the reference value, the memory device 100 may perform an overwrite operation in the memory cell group in operation S47. For example, the memory device 100 may sense states of the memory cells included in the memory cell group, compare the group data determined based on the sensed states with second group data, and program only the memory cells to be transited to different states from the sensed states.

Figure 11:
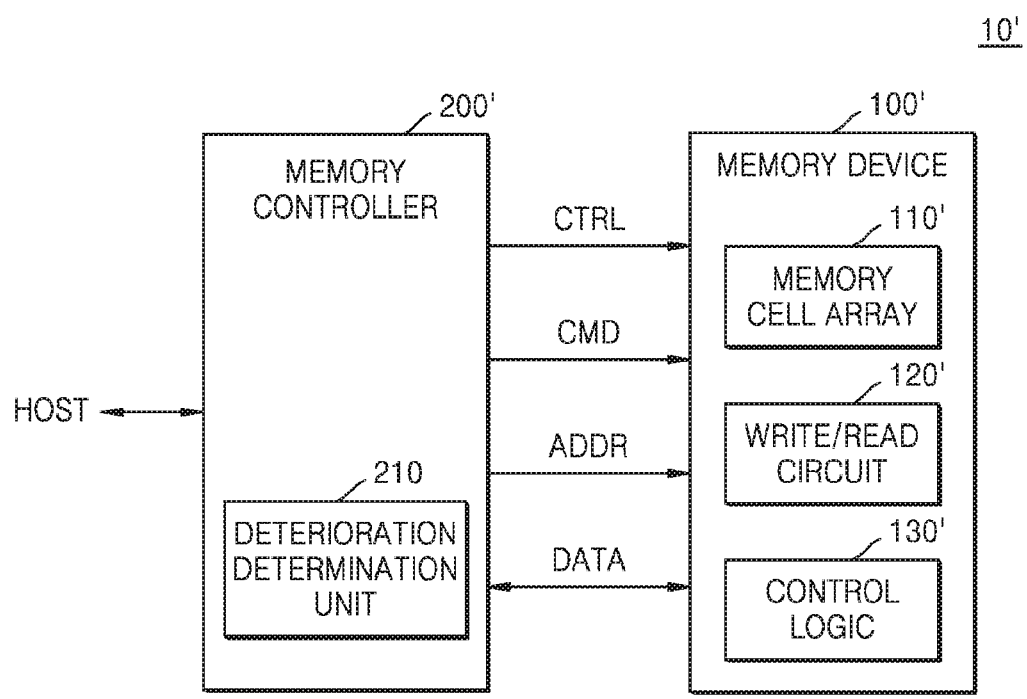
FIG. 11 is a block diagram of a memory system including a memory device and a memory controller, according to an exemplary embodiment.

FIG. 11 is a block diagram of a memory system 10' including a memory device 100' and a memory controller 200', according to an exemplary embodiment. According to an exemplary embodiment, the memory system 10' may include the memory device 100' and the memory controller 200', the memory controller 200' may transmit an address ADDR, a command CMD and a control signal CTRL, and data DATA may be exchanged between the memory device 100' and the memory controller 200'. The memory device 100' may include a memory cell array 110', a write/read circuit 120', and a control logic 130'. The memory cell array 110', the write/read circuit 120', and the control logic 130' may perform the same or similar functions as the memory cell array 110, the write/read circuit 120, and the control logic 130 included in the memory device 100 of FIG. 1.

According to an exemplary embodiment, the memory controller 200' may determine whether the memory cell or a group including the memory cell is deteriorated or not, and the memory device 100' may transmit information about a memory cell based on a result of the determination of the memory controller 200'. For example, the memory device 100' may transmit a result of a read operation to the memory controller 200', in response to a read command received from the memory controller 200'.

As illustrated in FIG. 11, the memory controller 200' may include a deterioration determination unit 210. The deterioration determination unit 210 may determine whether the memory cell included in the memory cell array 110' of the memory device 100' or the group including the memory cell is deteriorated or not, in response to a write quest request received from a host. For example, the memory controller 200' may transmit a first command or a second command that is different from the first command, to the memory device 100', according to a result of the determination of the deterioration determination unit 210. Detailed aspects with respect to the operation of the deterioration determination unit 210 will be described hereinafter with reference to FIGS. 12, 13, and 14.

Figure 12:
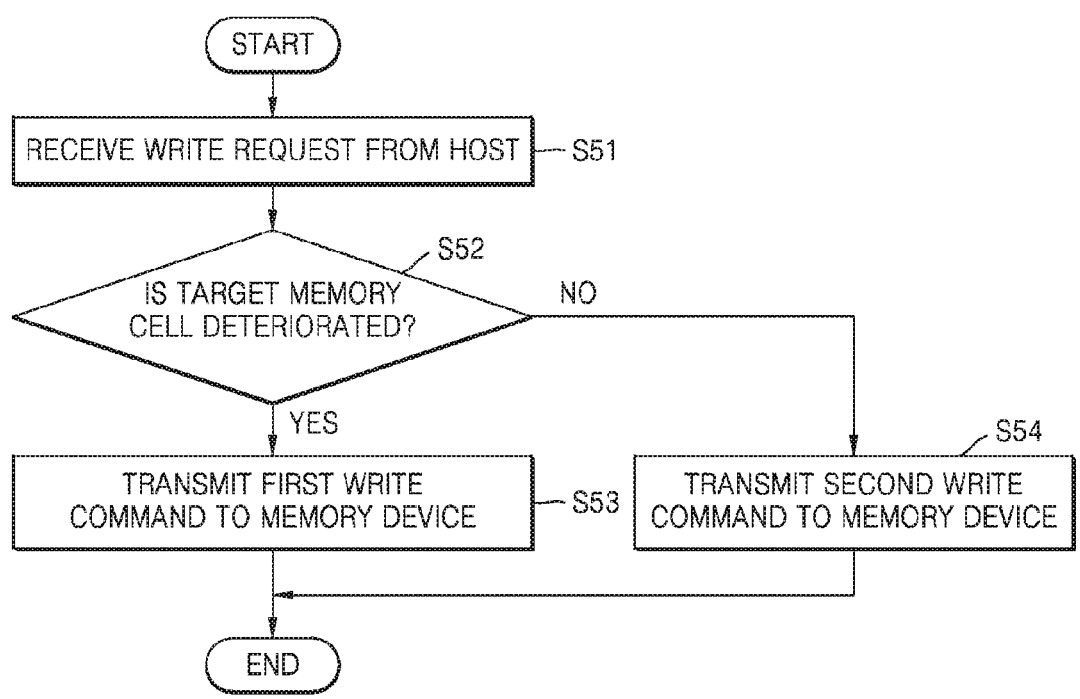
FIGS. 12 and 13 are flowcharts of a method of controlling a memory device, according to exemplary embodiments.
Figure 13:
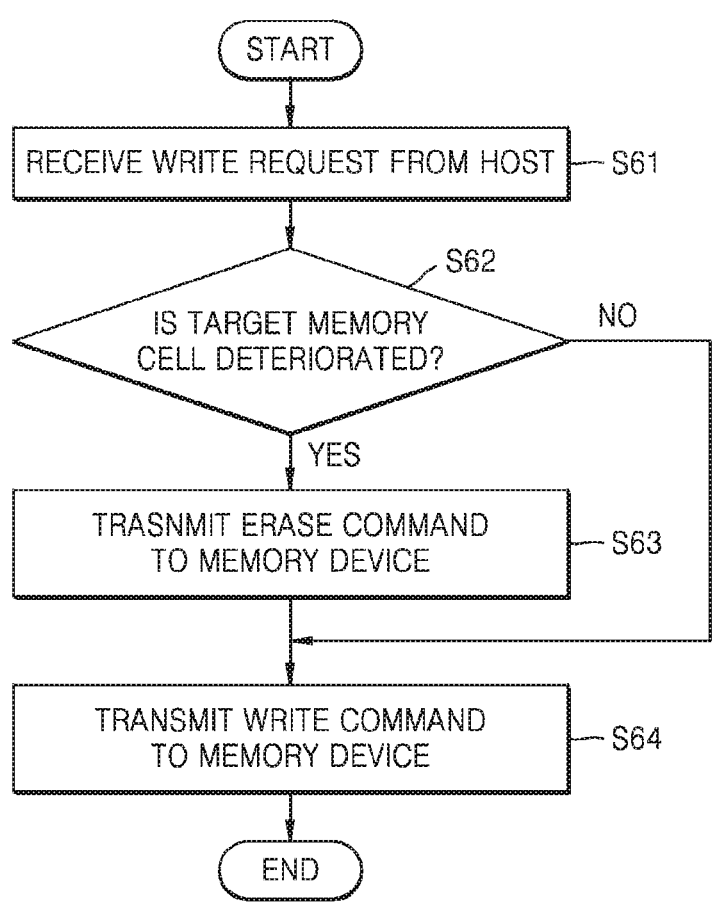

FIGS. 12 and 13 are flowcharts of a method of controlling a memory device, according to exemplary embodiments. In detail, FIG. 12 is a flowchart of a method of writing data in the memory device supporting a first write command and a second write command, and FIG. 13 is a flowchart of a method of controlling the memory device by using an erase command Referring to FIG. 11 together, according to an exemplary embodiment, the memory controller 200' may determine whether a memory cell included in the memory cell array 110' of the memory device 100' is deteriorated or not, and may require the memory device 100' for an operation of selectively erasing the memory cell before programming data, according to a result of the determination. Hereinafter, FIGS. 12 and 13 will be described together with reference to FIG. 11.

In the example illustrated in FIG. 12, the memory controller 200' may receive a write request from a host in operation SM. The write request may be accompanied by second data that is to be written in a target memory cell having a first state corresponding to first data. Then, the memory controller 200' may determine whether the target memory cell is deteriorated or not in operation S52. For example, the deterioration determination unit 210 may determine that the target memory cell is deteriorated when the cumulative number of write and/or read operations with respect to a memory cell group including the target memory cell is equal to or greater than a reference number or reaches a threshold. As another example, the deterioration determination unit 210 may determine that the target memory cell is deteriorated when the cumulative number of error occurrences in the read operations of the memory cell group including the target memory cell is equal to or greater than a reference number.

As another example, the deterioration determination unit 210 may determine that the target memory cell is deteriorated when a time period between a previous write operation and a subsequent write operation is equal to or higher than a reference time period. As another example, the deterioration determination unit 210 may receive a count value indicating the number of deteriorated cells included in the memory cell group including the target memory cell from the memory device 100', and when the received count value exceeds a reference value, the deterioration determination unit 210 may determine that the memory cell group is deteriorated. As another example, the deterioration determination unit 210 may include a counter and may transmit a command for requesting information for determining whether a memory cell included in the memory cell array 110' or a group including the memory cell is deteriorated to the memory device 100', in response to a write quest received from a host.

The counter included in the deterioration determination unit 210 may count the number of memory cells determined to be deteriorated based on the information about the memory cell received from the memory device 100'. The deterioration determination unit 210 may determine that the memory cell or the group including the memory cell is deteriorated when the output value of the counter is equal to or greater than a predetermined reference value. The deterioration determination unit 210 may store information with respect to write and/or read operations in a unit of a memory cell group, to determine whether the target memory cell is deteriorated or not.

When it is determined that the target memory cell is deteriorated, the memory controller 200' may transmit a first write command to the memory device 100', together with an address corresponding to the target memory cell, in operation S53. As described above, the memory device 100' may determine whether the target memory cell is deteriorated or not in response to the first write command, and may selectively erase the target memory cell according to a result of the determination.

When it is determined that the target memory cell is not deteriorated, the memory controller 200' may transmit a second write command to the memory device 100', together with the address corresponding to the target memory cell, in operation S54. As described above, the memory device 100' may perform an overwrite operation in the target memory cell, regardless of whether the target memory cell is deteriorated or not, in response to the second write command.

In the example illustrated in FIG. 13, the memory controller 200' may receive a write request from a host in operation S61, and the deterioration determination unit 210 may determine whether the target memory cell is deteriorated or not in operation S62. Operations S61 and S62 of FIG. 13 may include the same or substantially the same operations as operations SM and S52 of FIG. 12.

When it is determined that the target memory cell is deteriorated, the memory controller 200' may transmit an erase command for erasing the target memory cell to the memory device 100', together with an address corresponding to the target memory cell, in operation S63. Then, the memory controller 200' may transmit a write command to the memory device 100', together with the address corresponding to the target memory cell, in operation S64.

When it is determined that the target memory cell is not deteriorated, the memory controller 200' may transmit the write command to the memory device 100' together with the address corresponding to the target memory cell in operation S64. According to an exemplary embodiment, the write command in operation S64 may be the first or second write command of FIG. 12.

Figure 14:
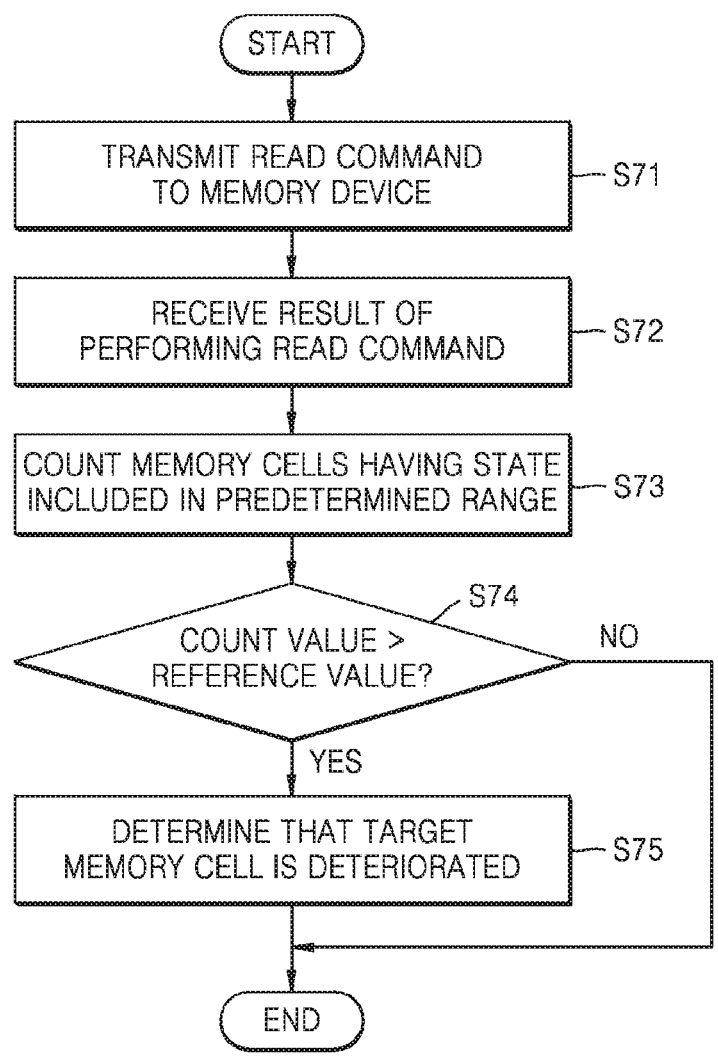
FIG. 14 is a flowchart of a method of determining whether a memory cell is deteriorated or not, according to an exemplary embodiment.

FIG. 14 is a flowchart of a method of determining whether a memory cell is deteriorated or not, according to an exemplary embodiment. According to an exemplary embodiment, the method illustrated in FIG. 14 may be implemented in operation S52 of FIG. 12 or operation S62 of FIG. 13. Hereinafter, FIG. 14 will be described with reference to FIG. 11.

According to an exemplary embodiment, the memory controller 200' may transmit a read command to the memory device 100' in response to a write command received from a host in operation S71. For example, the memory controller 200' may transmit the read command for reading data stored in an area of the memory cell array 110' corresponding to the write command received from the host, to the memory device 100'. Then, the memory controller 200' may receive a result of performing the read command from the memory device 100' in operation S72. For example, according to an exemplary embodiment, the write/read circuit 120' of the memory device 100' may sense a memory cell by using a reference signal for determining whether the memory cell of the memory cell array 110' is in a predetermined range, for example a read margin range, in response to the received read command. Based on a result of the sensing of the write/read circuit 120', the control logic 130' may transmit information with respect to the memory cell, such as information indicating whether the memory cell is in a predetermined range or not, to the memory controller 200', as the result of performing the read command.

The deterioration determination unit 210 of the memory controller 200' may count the number of memory cells having a state included in a predetermined range, based on, for example, information indicating whether the memory cell is in the predetermined range, as a result of performing the read command received from the memory device 100', in operation S73. For example, the deterioration determination unit 210 may include a counter and the counter may count the number of memory cells having the state included in the predetermined range. Next, the deterioration determination unit 210 may determine whether the count value is greater than a reference value in operation S74. For example, the deterioration determination unit 210 may determine whether the output value of the counter is greater than a predetermined reference value or threshold. When the counter value is greater than the reference value, the deterioration determination unit 210 may determine that all memory cells included in the group including the memory cell are deteriorated in operation S75.

Figure 15:
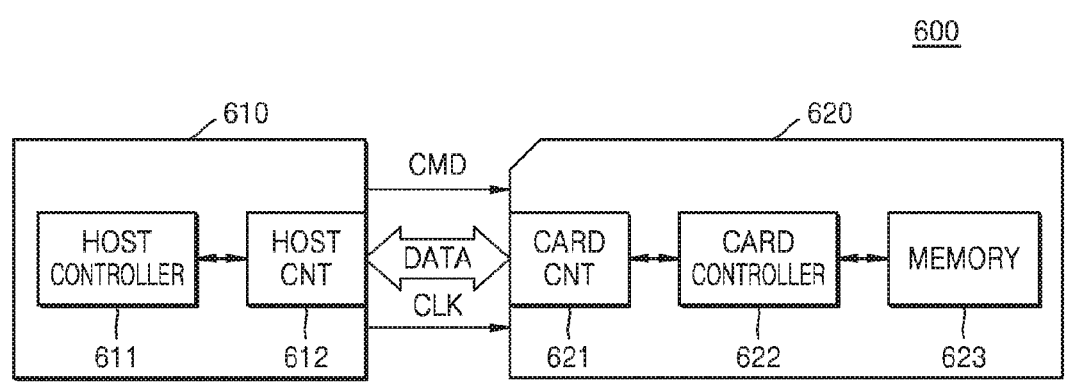
FIG. 15 is a block diagram illustrating an example of the memory system in a memory card system, according to an exemplary embodiment.

FIG. 15 is a block diagram of an example in which the memory system 10 is implemented in a memory card system 600, according to an exemplary embodiment. Hereinafter, the memory system 10 is assumed to be a resistive memory system.

Referring to FIG. 15, the memory card system 600 may include a host 610 and a memory card 620. The host 610 may include a host controller 611 and a host contact unit 612. The memory card 620 may include a card contact unit 621, a card controller 622, and a memory device 623. The card controller 622 and the memory device 623 may be realized by using the exemplary embodiments illustrated in FIGS. 1 through 13. For example, the memory device 623 may determine whether a target memory cell is deteriorated or not when receiving a first write command from the card controller 622, and may selectively erase the target memory cell, according to a result of the determination. Also, the card controller 622 may determine whether the target memory cell is deteriorated or not in response to a write request of the host 610, and may transmit another command to the memory device 623 according to a result of the determination.

The host 610 may write data in the memory card 620 or read data stored in the memory card 620. The host controller 611 may transmit a command CMD, a clock signal CLK generated in a clock generator (not shown) in the host 610, and data DATA, to the memory card 620 via a host contact unit 612.

The card controller 622 may store data in the memory device 623 by being synchronized with a clock signal generated in a clock generator (not shown) in the card controller 622, in response to the command received via the card contact unit 621. The memory device 623 may store data transmitted from the host 610.

The memory card 620 may be realized as a compact flash card (CFC), a micro drive, a smart media card (SMC), a multimedia card (MMC), a security digital card (SDC), a memory stick, or a USB flash memory driver.

Figure 16:
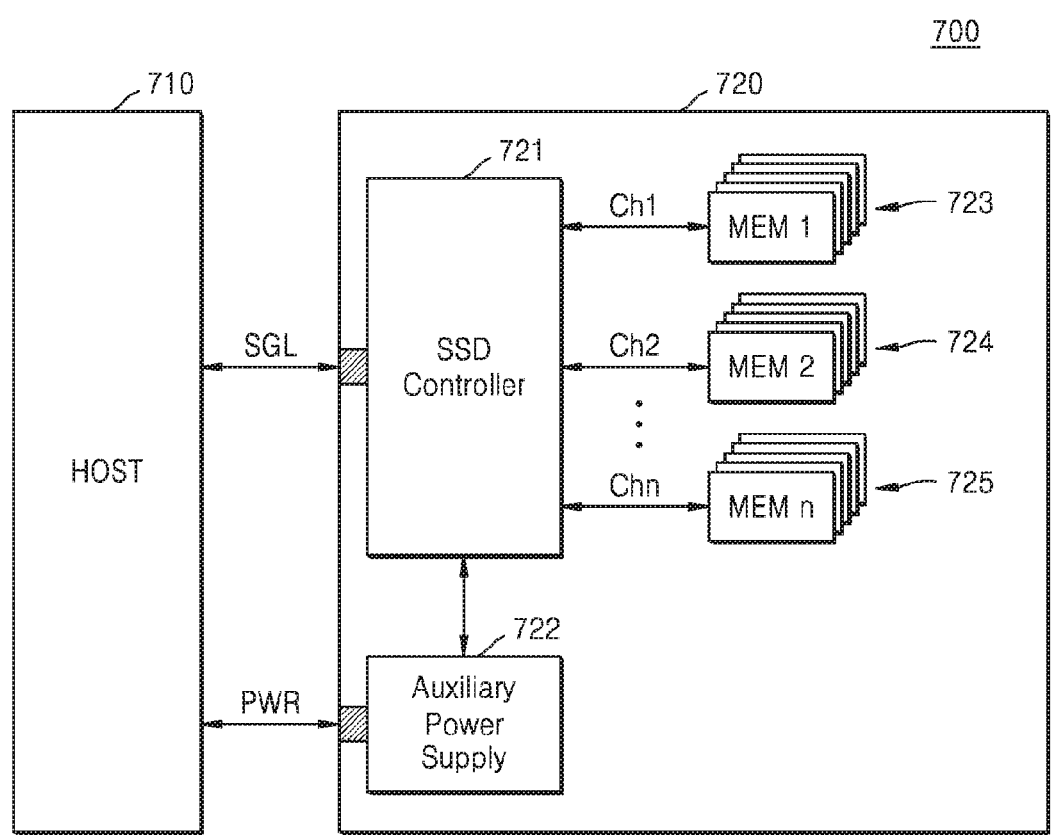
FIG. 16 is a block diagram illustrating an example of the memory system in a solid state disk (SSD) system, according to an exemplary embodiment.

FIG. 16 is a block diagram of an example in which the memory system 10 is implemented in an SSD system 700, according to an exemplary embodiment. Referring to FIG. 16, the SSD system 700 may include a host 710 and SSD 720. The SSD 720 may exchange signals with the host 710 via a signal connector and receive power via a power connector. The SSD 720 may include an SSD controller 721, an auxiliary power device 722, and a plurality of memory devices 723, 724, and 725.

The SSD 720 may be realized by using the exemplary embodiments illustrated in FIGS. 1 through 13. For example, each of the memory devices 723, 724, and 725 may determine whether a target memory cell is deteriorated or not when receiving a first write command from the SSD controller 721, and may selectively erase the target memory cell according to a result of the determination. Also, the SSD controller 721 may determine whether the target memory cell is deteriorated or not in response to a write request of the host 710, and may transmit another command to the memory devices 723, 724, and 725, according to a result of the determination.

Figure 17:
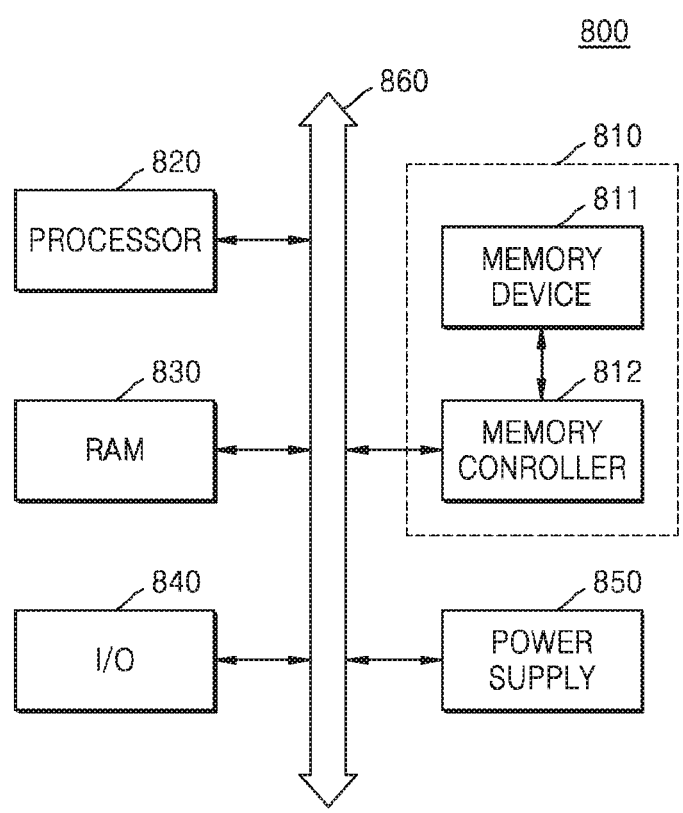
FIG. 17 is a block diagram illustrating a computing system including the memory system, according to an exemplary embodiment.

FIG. 17 is a block diagram of a computing system 800 including the memory system 10, according to an exemplary embodiment. The memory system 10 is assumed to be a resistive memory system.

Referring to FIG. 17, the computing system 800 may include a memory system 810, a processor 820, RAM 830, an input and output device 840, and a power device 850. Also, the memory system 810 may include the memory device 811 and the memory controller 812. The memory system 810 may be realized by using the exemplary embodiments illustrated in FIGS. 1 through 13. For example, the memory device 811 may determine whether a target memory cell is deteriorated or not when receiving a first write command from the memory controller 812, and may selectively erase the target memory cell according to a result of the determination. Also, the memory controller 812 may determine whether the target memory cell is deteriorated or not in response to a write request of other components connected in a bus 860, and may transmit another command to the memory device 811 according to a result of the determination.

Although not illustrated in FIG. 17, the computing system 800 may further include ports which may communicate with a video card, a sound card, a memory card, a USB device, or other electronic devices. The computing system 800 may be realized as a personal computer, or portable electronic device, such as a notebook computer, cellular phone, personal digital assistant (PDA), and camera.

The processor 820 may perform specific calculations or tasks. According to an exemplary embodiment, the processor 820 may be a micro-processor or a central processing unit (CPU). The processor 820 may communicate with the RAM 830, the input and output device 840, and the memory system 810 via the bus 860, such as an address bus, a control bus, and a data bus. Here, the memory system 810 and/or the RAM 830 may be realized by using the resistive memory according to the exemplary embodiments illustrated in FIGS. 1 through 13.

In some embodiments, the processor 820 may be connected to an extended bus, such as a peripheral component interconnect (PCI) bus.

The RAM 830 may store data necessary for an operation of the computing system 800. As described above, the RAM 830 may include the memory device according to the exemplary embodiments. Alternatively, DRAM, mobile DRAM, SRAM, PRAM, FRAM, MRAM, etc. may also be used as the RAM 830.

The input and output device 840 may include an input device, such as a keyboard, a keypad, and a mouse, and an output device, such as a printer and a display. The power device 850 may supply an operation voltage necessary for the operation of the computing system 800.

While the inventive concept has been particularly shown and described with reference to exemplary embodiments thereof, it will be understood that various changes in form and details may be made therein without departing from the spirit and scope of the following claims.

What is claimed is:

1. A method of operating a memory device comprising a plurality of memory cells, the method comprising:
   receiving a first write command for writing second data in a target memory cell, of the plurality of memory cells, having a first state corresponding to first data;
   determining whether the target memory cell is deteriorated based on the first state, in response to the first write command; and
   writing the second data by selectively erasing the target memory cell according to a result of the determination and by programming the target memory cell to have a second state corresponding to the second data.

2. The method of claim 1, wherein writing the second data comprises:
   when the target memory cell is determined to be deteriorated, performing a first programming in which the target memory cell is erased and the target memory cell is programmed to have the second state; and
   when the target memory cell is determined not to be deteriorated, performing a second programming in which the target memory cell is programmed to be transited from the first state to the second state.

3. The method of claim 2, wherein performing the second programming comprises:
   determining the first data from the first state;
   comparing the first data and the second data; and
   when the first data and the second data are different from each other, transiting the target memory cell from the first state to the second state.

4. The method of claim 3, wherein determining the first data comprises:
   generating a reference signal based on the second data; and
   sensing the first state by using the reference signal.

5. The method of claim 4, wherein the reference signal corresponds to a boundary of a read margin range proximate to the second state.

6. The method of claim 2, further comprising:
   receiving a second write command for writing the second data in the target memory cell; and
   performing the second programming in response to the second write command.

7. The method of claim 1, wherein determining whether the target memory cell is deteriorated comprises:
   sensing the target memory cell by using a reference signal;
   determining whether the first state is in a read margin range, based on a result of the sensing; and
   when the first state is in the read margin range, determining that the target memory cell is deteriorated.

8. The method of claim 1, wherein the first write command is a command for writing group data comprising the second data in a memory cell group comprising the target memory cell; and wherein determining whether the target memory cell is deteriorated comprises:
   sensing memory cells included in the memory cell group by using a reference signal;
   counting memory cells having a state in a read margin range, from among the memory cells provided in the memory cell group, based on a result of the sensing; and
   when a counted value exceeds a predetermine reference value, determining that the memory cell group is deteriorated.

9. The method of claim 8, wherein writing the second data comprises when the memory cell group is deteriorated, erasing the memory cell group and programming the memory cell group based on the group data.

10. The method of claim 8, further comprising:
    receiving a configuration command; and
    setting the reference value, in response to the configuration command.

11. A method of controlling a memory device comprising a plurality of memory cells, the method comprising:
    receiving a write request for writing second data in a target memory cell, of the plurality of memory cells, having a first state corresponding to first data;
    determining whether the target memory cell is deteriorated in response to the write request;

when the target memory cell is determined to be deteriorated, transmitting a first command to the memory device; and when the target memory cell is determined not to be deteriorated, transmitting a second command that differs from the first command to the memory device;

wherein the first command and the second command are accompanied by an address corresponding to the target memory cell.

12. The method of claim 11, wherein transmitting the first command comprises transmitting the second command following the first command, the first command being a command for erasing the target memory cell, and the second command being a command for writing the second data.

13. The method of claim 11, wherein each of the first command and the second command is a command for writing the second data; and wherein the memory device selectively erases the target memory cell according to a deterioration level of the target memory cell in response to the first command.

14. The method of claim 11, wherein determining whether the target memory cell is deteriorated comprises determining that the target memory cell is deteriorated when the cumulative number of write and/or read operations of a memory cell group comprising the target memory cell reaches a threshold.

15. The method of claim 11, wherein determining whether the target memory cell is deteriorated comprises:
    transmitting a read command corresponding to the target memory cell to the memory device;
    receiving information about the target memory cell from the memory device;
    counting the number of memory cells that are deteriorated, from among a memory cell group comprising the target memory cell, based on the information about the target memory cell; and
    determining that the memory cell group is deteriorated when the counted value exceeds a threshold.

16. A method of operating a memory device comprising a plurality of memory cells, the method comprising:
    determining whether a target memory cell, of the plurality of memory cells and having first data stored therein, is deteriorated; and
    writing second data by selectively
        erasing the target memory cell and programming the target memory cell to store the second data, when the target memory cell is determined to be deteriorated, and
        programming the target memory cell to transit from the first data to the second data, when the target memory cell is determined not to be deteriorated.

17. The method of claim 16, wherein programming comprises:
    determining the first data;
    comparing the first data and the second data; and
    when the first data and the second data are different from each other, transiting the target memory cell from the first data to the second data.

18. The method of claim 17, wherein determining the first data comprises determining the first data with a reference signal generated based on the second data.

19. The method of claim 17, further comprising:
    receiving a second write command for writing the second data in the target memory cell; and
    performing the second programming in response to the second write command.

20. The method of claim 17, wherein determining whether the target memory cell is deteriorated comprises:
    sensing the target memory cell based upon a reference signal; and
    determining that the target memory cell is deteriorated based on a result of the sensing and a read margin range.

* * * * *